(12) United States Patent
Yang et al.

(10) Patent No.: US 11,916,172 B2
(45) Date of Patent: Feb. 27, 2024

(54) EPITAXIAL STRUCTURE, SEMICONDUCTOR STRUCTURE INCLUDING THE SAME, AND SEMICONDUCTOR PICKUP ELEMENT FOR TRANSFERRING THE SAME

(71) Applicant: PlayNitride Display Co., Ltd., Zhunan Township, Miaoli County (TW)

(72) Inventors: Shiang-Ning Yang, Zhunan Township (TW); Yi-Min Su, Zhunan Township (TW); Yu-Yun Lo, Zhunan Township (TW); Bo-Wei Wu, Zhunan Township (TW); Tzu-Yu Ting, Zhunan Township (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 488 days.

(21) Appl. No.: 17/244,690

(22) Filed: Apr. 29, 2021

(65) Prior Publication Data
US 2021/0249566 A1 Aug. 12, 2021

Related U.S. Application Data

(63) Continuation-in-part of application No. 16/718,982, filed on Dec. 18, 2019, now Pat. No. 11,296,259.

(30) Foreign Application Priority Data

Sep. 16, 2019 (TW) ................................. 108133180

(51) Int. Cl.
*H01L 33/44* (2010.01)
*H01L 25/075* (2006.01)
(Continued)

(52) U.S. Cl.
CPC .......... *H01L 33/44* (2013.01); *H01L 25/0753* (2013.01); *H01L 25/167* (2013.01);
(Continued)

(58) Field of Classification Search
CPC ............. H01L 25/0753; H01L 21/6835; H01L 2221/68368; H01L 2221/68354
See application file for complete search history.

(56) References Cited

U.S. PATENT DOCUMENTS

2020/0043760 A1* 2/2020 He ...................... H01L 21/6835

FOREIGN PATENT DOCUMENTS

| CN | 109671661 A | 4/2019 |
| CN | 109935668 A | 6/2019 |

(Continued)

OTHER PUBLICATIONS

Taiwanese Office Action and Search Report dated Mar. 5, 2020, for corresponding Taiwanese Application No. 108133180.

*Primary Examiner* — Antonio B Crite
(74) *Attorney, Agent, or Firm* — Birch, Stewart, Kolasch & Birch, LLP (57) ABSTRACT

An epitaxial structure adapted to a semiconductor pickup element is provided. The semiconductor pickup element has at least one guiding structure and provided with a pickup portion. The epitaxial structure includes a semiconductor layer corresponding to the pickup portion and capable of being picked up by the semiconductor pickup element. The epitaxial structure also includes at least one alignment structure disposed on the semiconductor layer and corresponding to the at least one guiding structure, so that the epitaxial structure and the semiconductor pickup element are positioned relative to each other. The number of the at least one alignment structure matches the number of the at least one guiding structure.

16 Claims, 11 Drawing Sheets

(51) Int. Cl.
  *H01L 25/16* (2023.01)
  *H01L 21/683* (2006.01)
  *H01L 21/67* (2006.01)
  *H01L 33/54* (2010.01)
  *H01L 33/12* (2010.01)
  *H01L 33/20* (2010.01)
  *H01L 33/00* (2010.01)
  *H01L 33/58* (2010.01)

(52) U.S. Cl.
  CPC .............. *H01L 33/12* (2013.01); *H01L 33/20* (2013.01); *H01L 2933/0025* (2013.01)

(56) References Cited

FOREIGN PATENT DOCUMENTS

| | | |
|---|---|---|
| TW | I552387 B | 10/2016 |
| TW | 201705544 A | 2/2017 |
| TW | 201826567 A | 7/2018 |
| TW | 201929264 A | 7/2019 |
| WO | WO 2018/138687 A1 | 8/2018 |

\* cited by examiner

EPITAXIAL STRUCTURE, SEMICONDUCTOR STRUCTURE INCLUDING THE SAME, AND SEMICONDUCTOR PICKUP ELEMENT FOR TRANSFERRING THE SAME

CROSS REFERENCE TO RELATED APPLICATIONS

This application is a Continuation-In-Part of pending U.S. patent application Ser. No. 16/718,982, filed on Dec. 18, 2019, which claims priority of Taiwan Patent Application No. 108133180, filed on Sep. 16, 2019, the entirety of which is incorporated by reference herein.

BACKGROUND

Technical Field

Embodiments of the present disclosure relate in general to an epitaxial structure, and in particular they relate to an epitaxial structure, a semiconductor structure including the same, and a semiconductor pickup element for transferring the same.

Description of the Related Art

With the advancements being made in the field of optoelectronics technology, the size of optoelectronic components has gradually evolved toward miniaturization. In recent years, due to breakthroughs in the size of light-emitting diodes (LEDs), micro light-emitting diode (micro LED) displays, in which arrays of light-emitting diodes are arranged in an array, have increasingly interested people in the field. A micro LED display is an active micro semiconductor device display, and it is more energy-efficient than organic light-emitting diode (OLED) displays. Furthermore, a micro LED display has better contrast performance than an OLED display, and it is visible in sunlight.

Nowadays, there are many ways to transfer micro LED chips from a carrier substrate to a circuit backplane. The most common method is to use a transfer head to pick up chips in batches, for example, using a sticking method. In order to avoid low pick-up yield due to offset, the contact area of the transfer head is designed to be much larger than that of the chip. Since the contact position is difficult to accurately control, the entire contact surface of the transfer head is glued to provide adhesion. However, such design cannot control the sticking position and is prone to shift, causing the chip to be misaligned with the calibration bump pad during subsequent bonding to the circuit backplane. Moreover, a single transfer head may easily obtain multiple chips in a dense chip array. Furthermore, if the chip that is picked up is bigger than the area of the corresponding bump pad, it may cause uneven force and crush the chip during bonding.

SUMMARY

The epitaxial structure according to the embodiments of the present disclosure is adapted to the semiconductor pickup element. The semiconductor pickup element has at least one guiding structure corresponding to the alignment structure of the epitaxial structure, and the semiconductor pickup element is provided with a pickup portion for the semiconductor layer of the epitaxial structure, which may pick up the epitaxial structure more accurately, thereby preventing shift.

Some embodiments of the present disclosure include an epitaxial structure adapted to a semiconductor pickup element. The semiconductor pickup element has at least one guiding structure and is provided with a pickup portion. The epitaxial structure includes a semiconductor layer corresponding to the pickup portion and capable of being picked up by the semiconductor pickup element. The epitaxial structure also includes at least one alignment structure disposed on the semiconductor layer and corresponding to the at least one guiding structure, so that the epitaxial structure and the semiconductor pickup element are positioned relative to each other. The number of the at least one alignment structure matches the number of the at least one guiding structure.

Some embodiments of the present disclosure include a semiconductor structure. The semiconductor structure includes a semiconductor pickup element having at least one guiding structure and provided with a pickup portion. The semiconductor structure also includes an epitaxial structure adapted to the semiconductor pickup element. The epitaxial structure includes a semiconductor layer corresponding to the pickup portion and capable of being picked up by the semiconductor pickup element. The epitaxial structure also includes at least one alignment structure disposed on the semiconductor layer and corresponding to the at least one guiding structure, so that the epitaxial structure and the semiconductor pickup element are positioned relative to each other. The number of the at least one alignment structure matches the number of the at least one guiding structure.

Some embodiments of the present disclosure include a semiconductor pickup element for transferring an epitaxial structure. The semiconductor pickup element includes at least one guiding structure disposed on the periphery of the semiconductor pickup element. The semiconductor pickup element also includes a pickup portion for picking up an epitaxial structure. The epitaxial structure includes a semiconductor layer and at least one alignment structure disposed on the semiconductor layer. The alignment structure corresponds to the guiding structure.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 1:
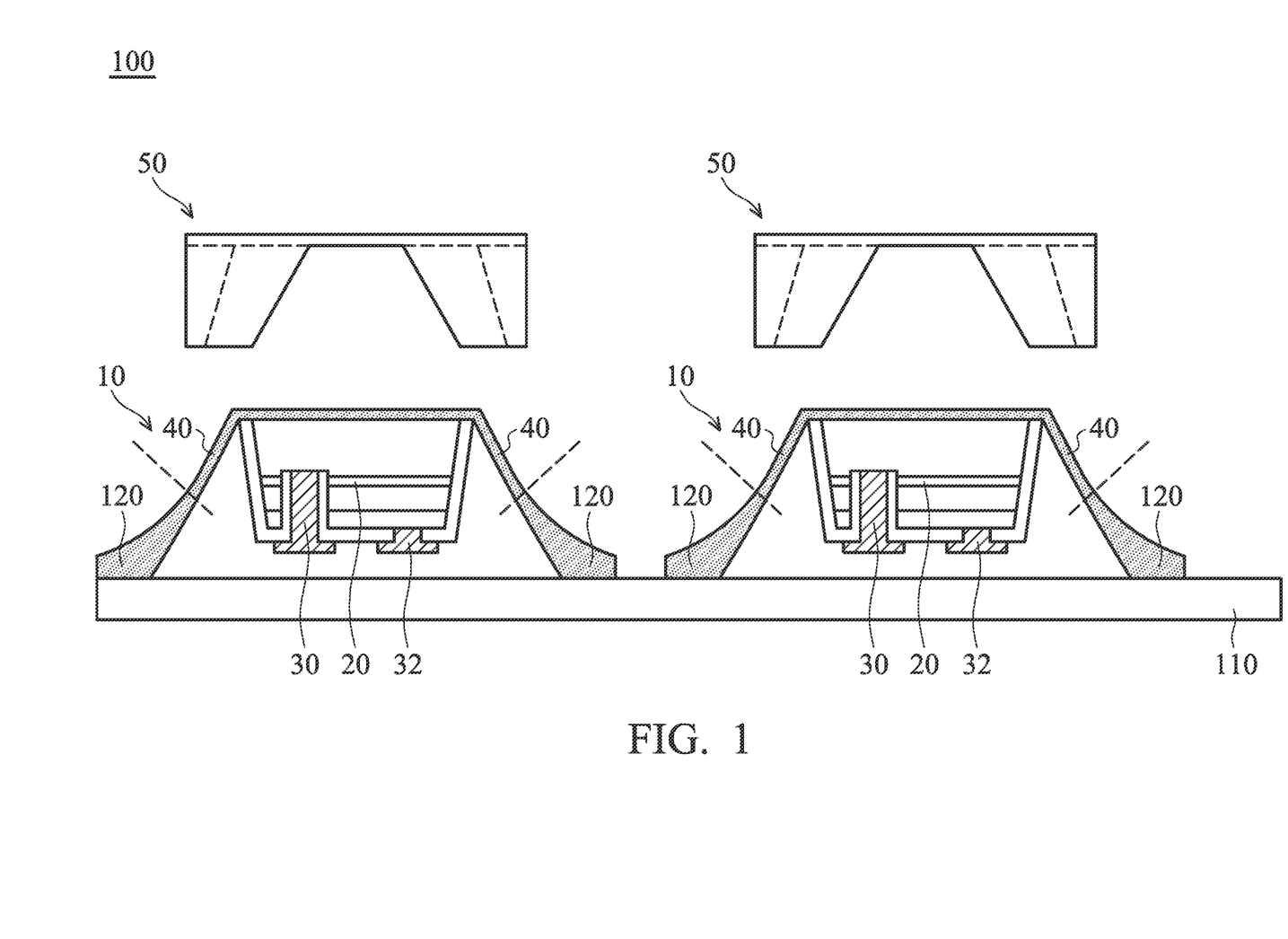
FIG. 1 is a partial cross-sectional view illustrating the epitaxial structure and the semiconductor pickup element according to one embodiment of the present disclosure.

FIG. 1 is a partial cross-sectional view illustrating the epitaxial structure 10 and the semiconductor pickup element 50 according to one embodiment of the present disclosure. It should be noted that some components of the epitaxial structure 10 and the semiconductor pickup element 50 have been omitted in FIG. 1 for the sake of brevity.

As shown in FIG. 1, a plurality of epitaxial structures 10 may be disposed on a carrier substrate 110, and a plurality of semiconductor pickup element 50 may be used for transferring corresponding epitaxial structures 10, for example, to a receiving substrate (e.g., a display substrate) (not shown), thereby obtaining a display device (e.g., micro LED display device). That is, the epitaxial structure 10 is adapted to the semiconductor pickup element 50.

The transfer process may be a mass transfer process. The mass transfer process may be performed to transfer the epitaxial structure 10 from the carrier substrate 110 to the receiving substrate one at a time or in a batch.

Moreover, the carrier substrate 110 may be a template, for carrying the epitaxial structures 10. For example, the carrier substrate 110 may be a plastic substrate, ceramic substrate, glass substrate, sapphire substrate, or another rigid substrate, but the present disclosure is not limited thereto.

Referring to FIG. 1, in some embodiments, the epitaxial structure 10 includes a semiconductor layer 20. The semiconductor layer 20 includes a first-type semiconductor layer, a light-emitting layer, and a second-type semiconductor layer. The first semiconductor layer and the second semiconductor layer have opposite electrical properties. For example, the first semiconductor layer may be an n-type semiconductor layer and the second semiconductor layer may be a p-type semiconductor layer, but the present disclosure is not limited thereto. The light-emitting layer and the second semiconductor layer are disposed sequentially on the first semiconductor layer. Namely, the light-emitting layer may be disposed between the first semiconductor layer and the second semiconductor layer.

As shown in FIG. 1, in some embodiments, the epitaxial structure 10 includes a first-type electrode 30 and a second-type electrode 32 disposed on the bottom surface of the semiconductor layer 20. That is, the epitaxial structure 10 may be a horizontal structure micro semiconductor chip or a flip-chip structure micro semiconductor chip (i.e., the first-type electrode 30 and the second-type electrode 32 are disposed on the same side of the semiconductor layer 20), but the present disclosure is not limited thereto.

The first-type electrode 30 may be (electrically) connected to the first-type semiconductor layer, and the second-type electrode 32 may be (electrically) connected to the second-type semiconductor layer. Moreover, the first-type electrode 30 and the second-type electrode 32 may include magnesium, calcium, aluminum, silver, indium, gold, tungsten, nickel, platinum, copper, an alloy thereof, an oxide thereof, or a combination thereof, but the present disclosure is not limited thereto. The method for forming the first-type electrode 30 and the second-type electrode may include thermal evaporation, sputtering, or plasma enhanced chemical vapor deposition.

Referring to FIG. 1, in some embodiments, the epitaxial structure 10 includes at least one alignment structure 40 disposed on the semiconductor layer 20. For example, the alignment structure 40 may be a portion of the supporting element 120. As shown in FIG. 1, one end of the supporting element 120 is disposed on the carrier substrate 110, and the other end of the supporting element 120 is connected to the top surface of the semiconductor layer 20, so that the epitaxial structure 10 is temporarily fixed on the carrier substrate 110 via the supporting element 120.

The supporting element 120 may temporarily fix the epitaxial structure 10 on the carrier substrate 110 for keeping a specific distance between two adjacent epitaxial structures 10. As a result, the supporting element 120 may prevent the epitaxial structures 10 from being damaged during the subsequent transfer process, thereby enhancing the yield of the subsequent transfer process.

Moreover, the supporting element 120 may be broken at the dashed line in FIG. 1 during the transfer process, and the portion connected (disposed) on the semiconductor layer 20 is as the alignment structure 40. The alignment structure 40 (or the supporting element 120) may be inorganic material or resin material. In some embodiments, the alignment structure 40 (or the supporting element 120) includes a thermal curable material, and the thermal curable material has a thermal curing temperature between about 50° C. and about 250° C. (e.g., 100° C., 150° C., 200° C. or 250° C.). The thermal curable material is a sticky liquid at room temperature. Since the thermal curable material changes its chemical properties during heating, the thermal curable material is converted into a solid after heating above the thermal curing temperature.

In some embodiments, the refractive index of the alignment structure 40 (or the supporting element 120) is greater than 1 and less than (or equal to) the refractive index of the epitaxial structure 10. For example, the refractive index of the alignment structure 40 (or the supporting element 120) may be from about 1.05 to about 2.5 (e.g., as 1.05, 1.5, 2.0 or 2.5). Moreover, the light transmittance of the alignment structure 40 (or the supporting element 120) may be greater than or equal to 80% (e.g., 80%, 90% or 98%), but the present disclosure is not limited thereto.

Figure 2:
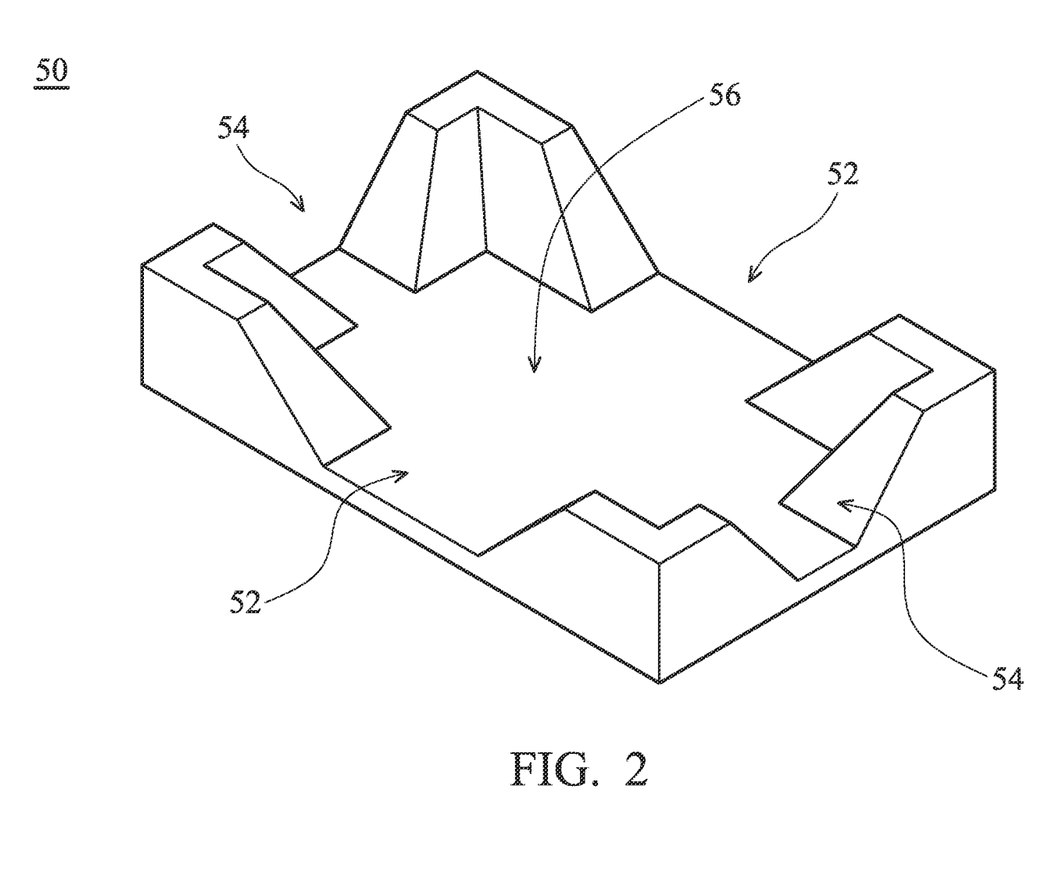
FIG. 2 is a three-dimensional view illustrating the semiconductor pickup element according to one embodiment of the disclosure.
Figure 3:
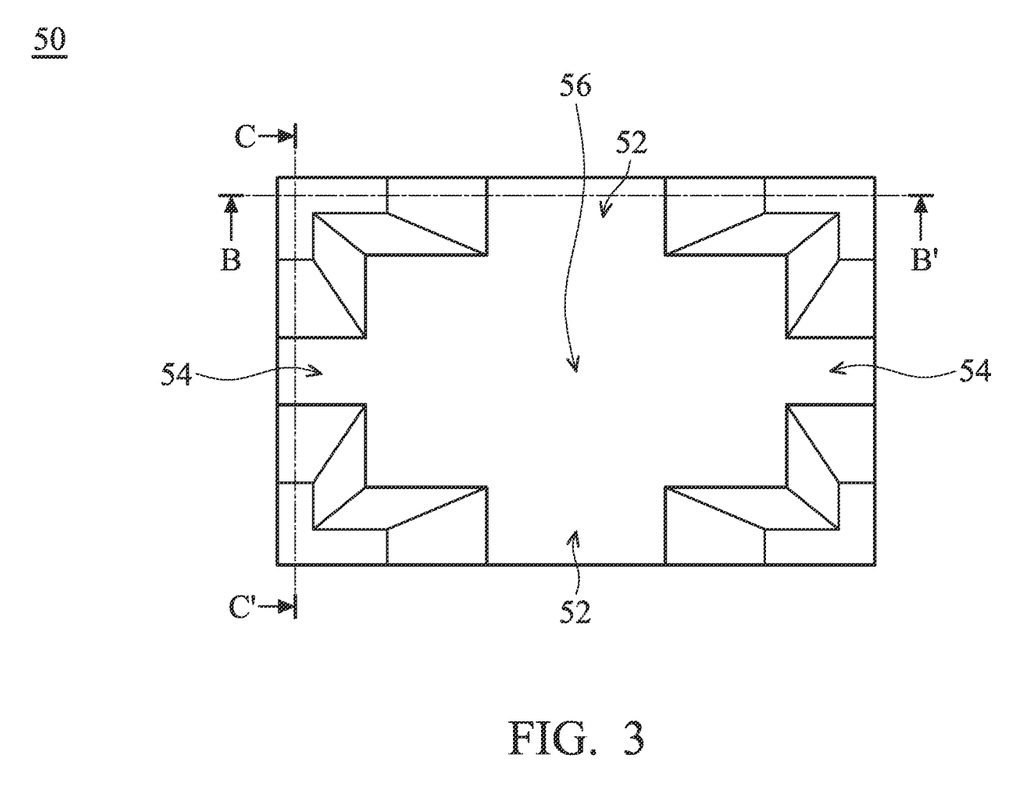
FIG. 3 is a top view illustrating the semiconductor pickup element according to one embodiment of the disclosure.
Figure 4A:
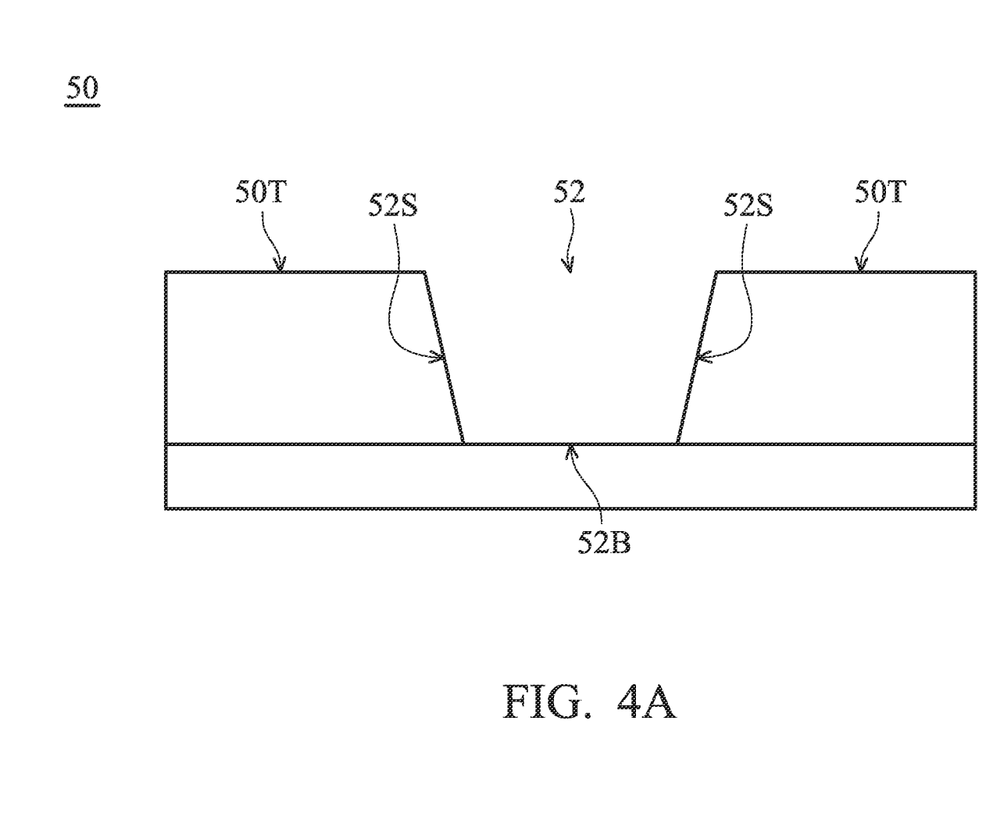
FIG. 4A is a cross-sectional view of the semiconductor pickup element along line B-B' in FIG. 3.
Figure 4B:
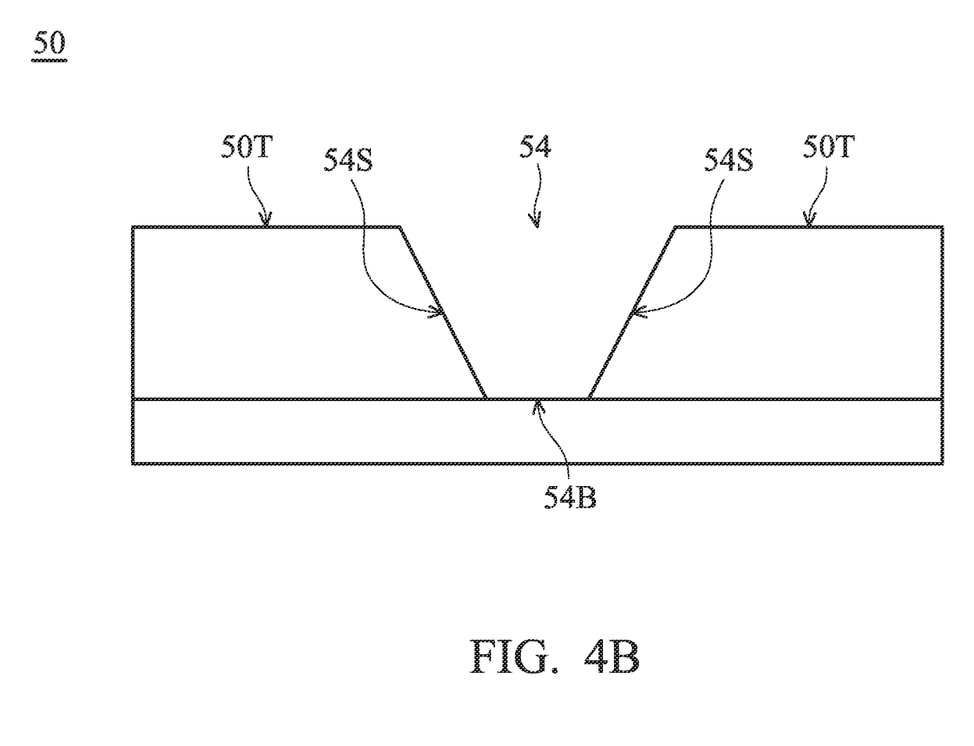
FIG. 4B is a cross-sectional view of the semiconductor pickup element along line C-C' in FIG. 3.

FIG. 2 is a three-dimensional view illustrating the semiconductor pickup element 50 according to one embodiment of the disclosure. FIG. 3 is a top view illustrating the semiconductor pickup element 50 according to one embodiment of the disclosure. FIG. 4A is a cross-sectional view of the semiconductor pickup element 50 along line B-B' in FIG. 3. FIG. 4B is a cross-sectional view of the semiconductor pickup element 50 along line C-C' in FIG. 3. It should be noted that some components of the semiconductor pickup element 50 have been omitted in FIG. 2 to FIG. 4B for the sake of brevity.

Referring to FIG. 2 and FIG. 3, in some embodiments, the semiconductor pickup element 50 has guiding structures 52 and guiding structures 54. The guiding structures 52 are arranged symmetrically on the semiconductor pickup element 50, and guiding structures 54 are arranged symmetrically on the semiconductor pickup element 50. As shown in FIG. 2 and FIG. 3, in some embodiments, the guiding structures 52 and the guiding structures 54 are disposed on the periphery of the semiconductor pickup element 50.

As shown in FIG. 2 and FIG. 3, in some embodiments, the guiding structure 52 and the guiding structure 54 have different sizes. For example, the maximum width of the guiding structure 52 may be larger than the maximum width of the guiding structure 54, but the present disclosure is not limited thereto. As shown in FIG. 2 and FIG. 3, in some embodiments, each of the guiding structures 52 and the guiding structures 54 is a trench formed in the semiconductor pickup element.

Referring to FIG. 3 and FIG. 4A, in some embodiments, the guiding structures 52 (the trench) includes a bottom surface 52B and two guiding inclined surfaces 52S, and the guiding inclined surfaces 52S are located on both sides of the bottom surface 52B. As shown in FIG. 4A, in some embodiments, the distance between the guiding inclined surfaces 52S increases gradually from the bottom surface 52B to the opening of the guiding structures 52 (the trench).

Referring to FIG. 3 and FIG. 4B, similarly, in some embodiments, the guiding structures 54 (the trench) includes a bottom surface 54B and two guiding inclined surfaces 54S, and the guiding inclined surfaces 54S are located on both sides of the bottom surface MB. As shown in FIG. 4B, in some embodiments, the distance between the guiding inclined surfaces 54S increases gradually from the bottom surface 54B to the opening of the guiding structures 54 (the trench).

Referring to FIG. 2 and FIG. 3, in some embodiments, the semiconductor pickup element 50 is provided with a pickup portion 56 for picking up the epitaxial structure 10.

Figure 5:
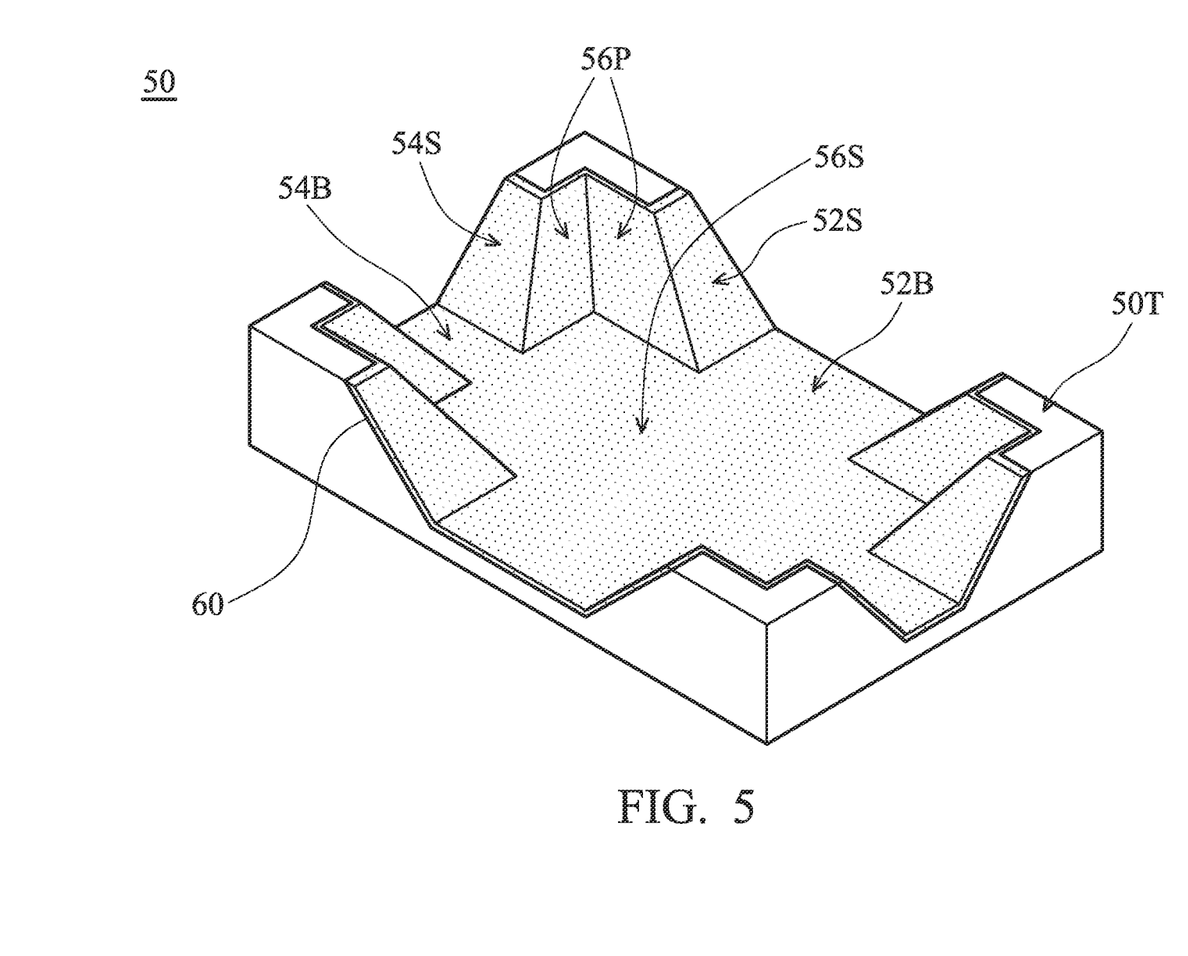
FIG. 5 is a three-dimensional view illustrating an adhesion layer disposed on the inner surface of the semiconductor pickup element according to one embodiment of the disclosure.

FIG. 5 is a three-dimensional view illustrating an adhesion layer 60 disposed on the inner surface of the semiconductor pickup element 50 according to one embodiment of the disclosure. Referring FIG. 5, in some embodiments, the pickup portion 56 includes a pickup surface 56S recessed on the semiconductor pickup element 50 and a plurality of positioning inclined surfaces 56P disposed around the pickup surface 56S. As shown in FIG. 5, in some embodiments, the distance between the positioning inclined surfaces 56P increases gradually from the pickup surface 56S to the opening of the pickup portion 56.

As shown in FIG. 5, in some embodiments, the adhesion layer 60 is disposed on the pickup surface 56S of the pickup portion 56. In some embodiments, a portion of the adhesion layer 60 is extendedly disposed on the positioning inclined surfaces 56P of the pickup portion 56. In other words, in some embodiments, the adhesion layer 60 is disposed between the pickup surface 56S and the opening of the pickup portion 56. That is, the adhesion layer 60 may be disposed on the entire inner surface of the pickup portion 56 of the semiconductor pickup element 50.

As shown in FIG. 5, the adhesion layer 60 may also be disposed on the bottom surface 52B of the guiding structure 52 and the bottom surface 54B of the guiding structure 54. Moreover, a portion of the adhesion layer 60 may be disposed on the guiding inclined surfaces 52S of the guiding structure 52 and the guiding inclined surfaces MS of the guiding structure 54. That is, the adhesion layer 60 may be disposed inside the guiding structure 52 and/or the guiding structure 54, but the present disclosure is not limited thereto.

Since the adhesion layer 60 is disposed on the inner surface of the pickup portion 56 (and the surrounding surface, e.g., the guiding inclined surfaces 52S and the guiding inclined surfaces 54S), not on the topmost surface 50T of the semiconductor pickup element 50, a single semiconductor pickup element 50 may not obtain multiple epitaxial structures 10 even in a dense epitaxial structure array.

Figure 6:
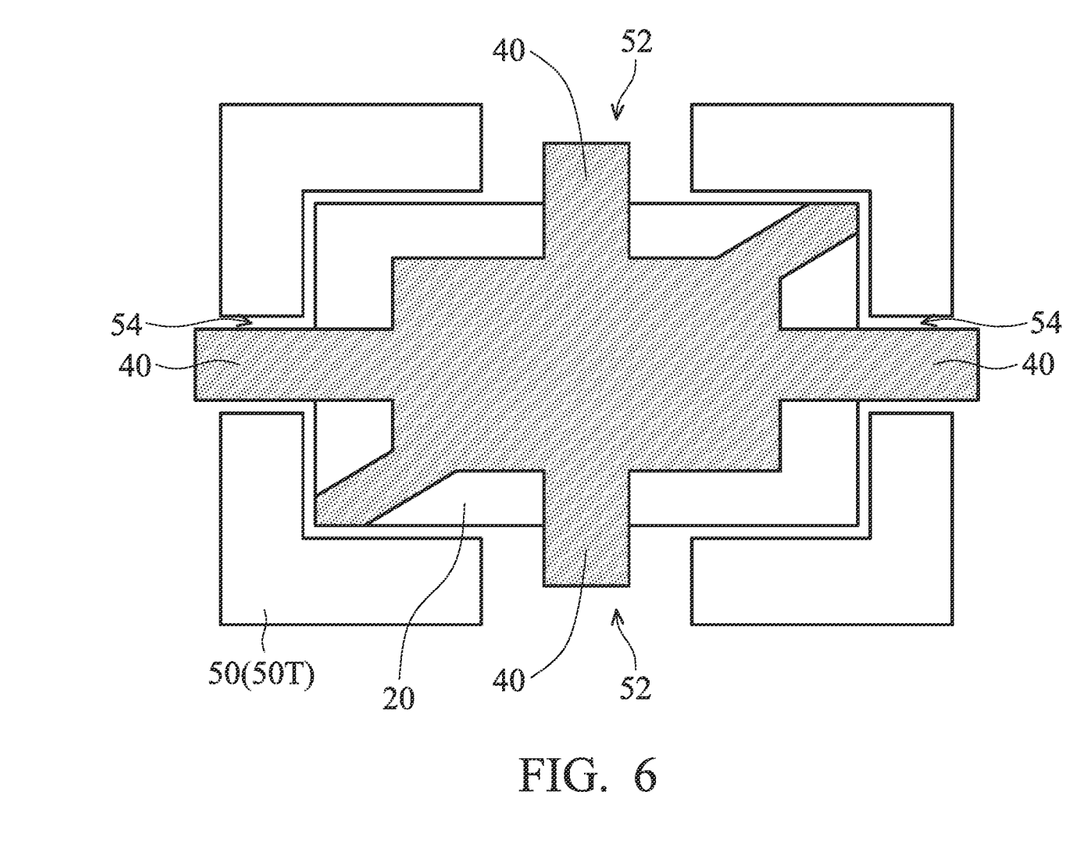
FIG. 6 is a schematic diagram of the pickup element picking up the epitaxial structure according to one embodiment of the present disclosure.

FIG. 6 is a schematic diagram of the pickup element 50 picking up the epitaxial structure 10 according to one embodiment of the present disclosure. It should be noted that some components of the epitaxial structure 10 and the semiconductor pickup element 50 have been omitted in FIG. 6 for the sake of brevity.

Referring to FIG. 6, in some embodiments, the semiconductor layer 20 corresponds to the pickup portion 56 and is capable of being picked up by the semiconductor pickup element 50, and the alignment structures 40 are disposed on the semiconductor layer 20 and correspond to the guiding structures 52 and the guiding structures 54, so that the epitaxial structure 10 and the semiconductor pickup element 50 are positioned relative to each other.

In some embodiments, the number of alignment structures 40 matches the number of guiding structures. In some embodiments, there are more than one alignment structure 40 and more than one guiding structure. For example, as shown in FIG. 6, the epitaxial structure 10 may include four alignment structures 40 that correspond to two guiding structures 52 and two guiding structures 54, but the present disclosure is not limited thereto.

In some embodiments, the alignment structure 40 extends outward from the semiconductor layer 20 as shown in FIG. 6. In some embodiments, the guiding structure 52 is a trench formed in the semiconductor pickup element 50 as shown in FIG. 4A, the guiding structure 54 is a trench formed in the semiconductor pickup element 50 as shown in FIG. 4B, and the guiding structures 52 and the guiding structures 54 accommodate the alignment structures 40 as shown in FIG. 6.

As shown in FIG. 6, in some embodiments, the alignment structures 40 are disposed on the top surface of the semiconductor layer 20. In some embodiments, from the top view of the epitaxial structure 10, the shape of the alignment structures 40 on the top surface of the semiconductor layer 20 includes a straight line, a cruciform asterisk shape, or a combination thereof.

As shown in FIG. 4A, FIG. 4B and FIG. 6, since the distance between the guiding inclined surfaces 52S increases gradually from the bottom surface 52B to the opening of the guiding structures 52, the distance between the guiding inclined surfaces 54S increases gradually from the bottom surface 54B to the opening of the guiding structures 54, and since the number of alignment structures 40 matches the number of guiding structures 52 and guiding structures 54, the guiding inclined surfaces 52S and the guiding inclined surfaces 54S may guide the alignment structures 40 into the guiding structures 52 and the guiding structures 54, thereby limiting the epitaxial structure 10 in the corresponding pickup portion 56 of the semiconductor pickup element 50.

Moreover, the inner space of the pickup portion 56 may be bigger than the semiconductor layer 20 of the epitaxial structure 10. As shown in FIG. 5 and FIG. 6, since the distance between the positioning inclined surfaces 56P increases gradually from the pickup surface 56S to the opening of the pickup portion 56, thereby positioning the epitaxial structure 10 in (or near) the center of the pickup portion 56 of the semiconductor pickup element 50.

Figure 7:
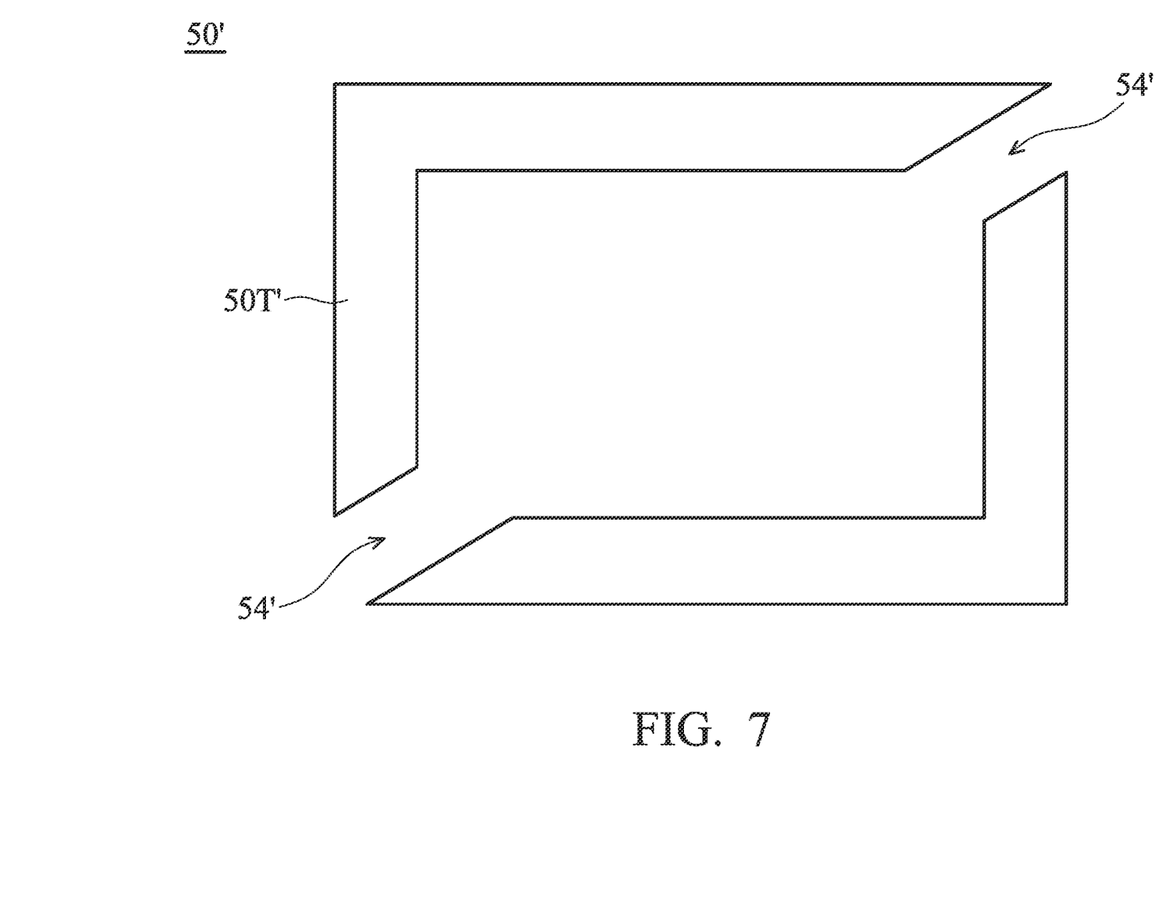
FIG. 7 is a top view illustrating the semiconductor pickup element according to another embodiment of the present disclosure.
Figure 8:
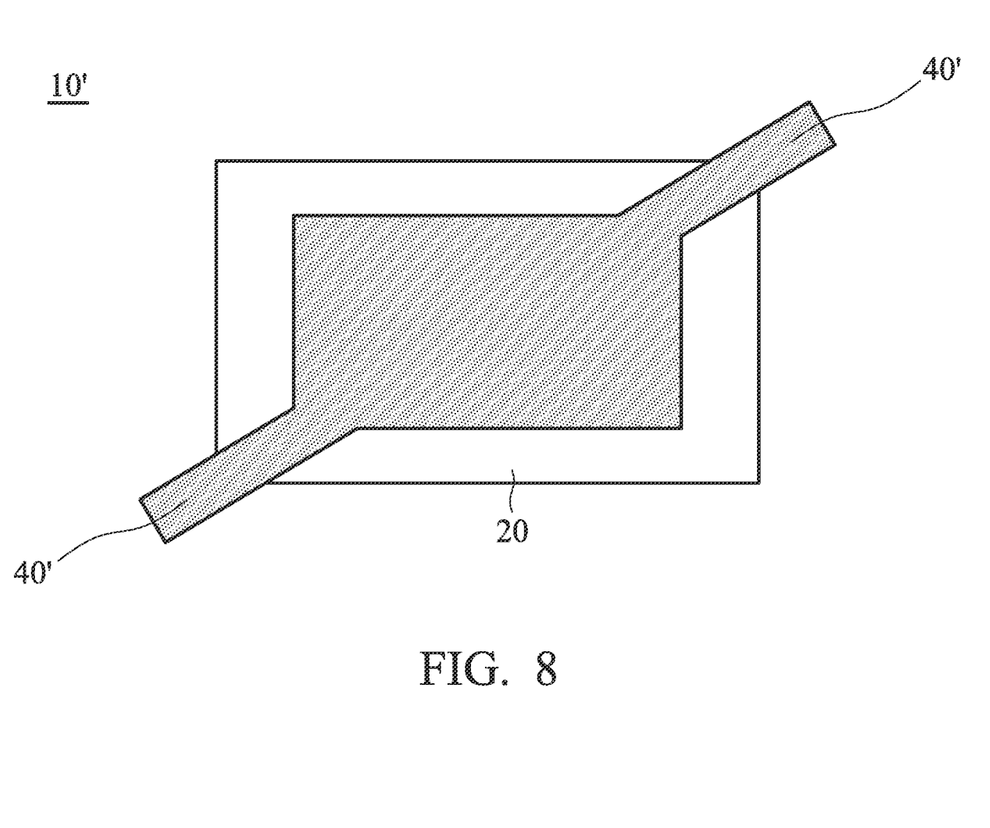
FIG. 8 is a top view illustrating the epitaxial structure according to another embodiment of the present disclosure.

FIG. 7 is a top view illustrating the semiconductor pickup element 50' according to another embodiment of the present disclosure. FIG. 8 is a top view illustrating the epitaxial structure 10' according to another embodiment of the present disclosure. For example, the epitaxial structure 10' shown in FIG. 8 is adapted to the semiconductor pickup element 50' shown in FIG. 7. It should be noted that in order to show the shape of the semiconductor pickup element 50' and the position of its guiding structures 54' more clearly, FIG. 7 only shows the top surface 50T' of the semiconductor pickup element 50'.

As shown in FIG. 7, the guiding structures 54' are disposed on the periphery of the semiconductor pickup element 50' and at a diagonal position. As shown in FIG. 8, two alignment structures 40' extend outward from the semiconductor layer 20, and the shape of the alignment structures 40' on the top surface of the semiconductor layer 20 includes a straight line that partially overlaps a diagonal of the top surface of the semiconductor layer 20.

Figure 9:
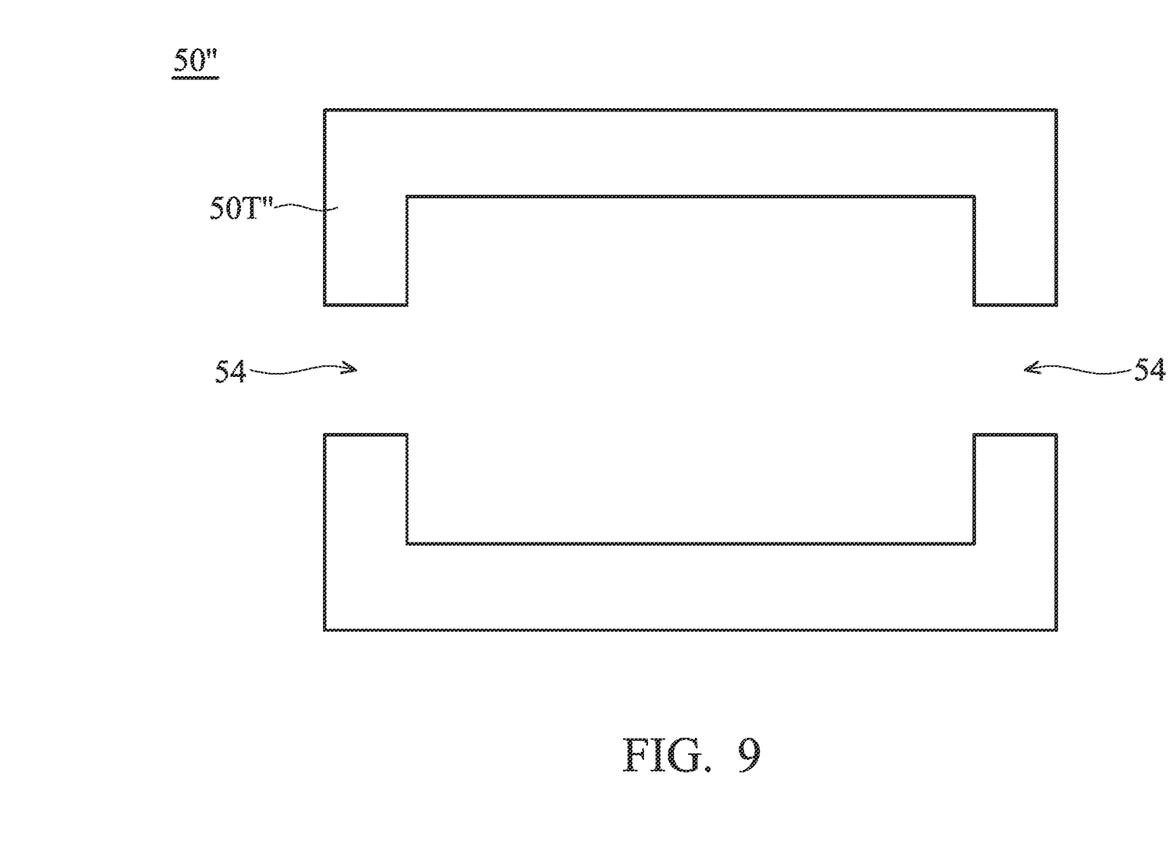
FIG. 9 is a top view illustrating the semiconductor pickup element according to another embodiment of the present disclosure.
Figure 10:
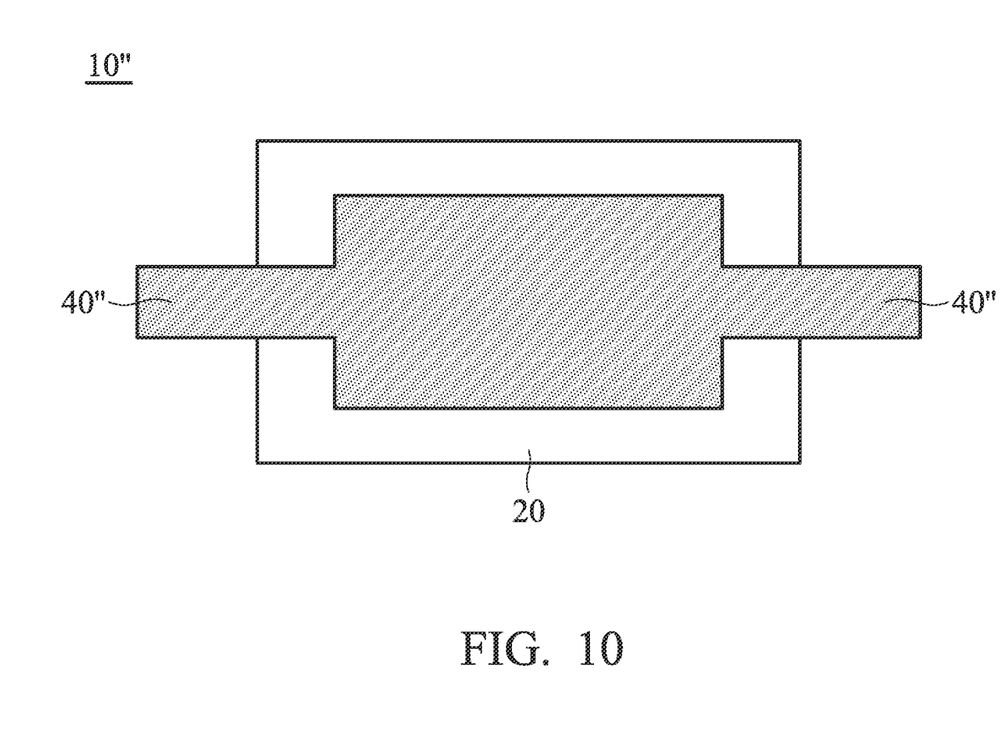
FIG. 10 is a top view illustrating the epitaxial structure according to another embodiment of the present disclosure.

FIG. 9 is a top view illustrating the semiconductor pickup element 50" according to another embodiment of the present disclosure. FIG. 10 is a top view illustrating the epitaxial structure 10" according to another embodiment of the present disclosure. For example, the epitaxial structure 10" shown in FIG. 10 is adapted to the semiconductor pickup element 50" shown in FIG. 9. It should be noted that in order to show the shape of the semiconductor pickup element 50" and the position of its guiding structures 54 more clearly, FIG. 9 only shows the top surface 50T" of the semiconductor pickup element 50".

As shown in FIG. 9, the guiding structures 54 are disposed on the periphery of the semiconductor pickup element 50". As shown in FIG. 10, two alignment structures 40" extend outward from the semiconductor layer 20, and the shape of the alignment structures 40" on the top surface of the semiconductor layer 20 includes a straight line that is parallel to one long side of the top surface of the semiconductor layer 20.

In summary, the epitaxial structure according to the embodiments of the present disclosure is adapted to the semiconductor pickup element. The semiconductor pickup element has at least one guiding structure corresponding to the alignment structure of the epitaxial structure, and the semiconductor pickup element is provided with a pickup portion for the semiconductor layer of the epitaxial structure, which may pick up the epitaxial structure more accurately, thereby preventing shift.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An epitaxial structure adapted to a semiconductor pickup element, wherein the semiconductor pickup element has at least one guiding structure and is provided with a pickup portion, and the epitaxial structure comprises:
    a semiconductor layer corresponding to the pickup portion and capable of being picked up by the semiconductor pickup element; and
    at least one alignment structure disposed on the semiconductor layer and corresponding to the at least one guiding structure, so that the epitaxial structure and the semiconductor pickup element are positioned relative to each other, wherein the number of the at least one alignment structure matches the number of the at least one guiding structure.

2. The epitaxial structure according to claim 1, wherein a refractive index of the alignment structure is greater than 1, and the refractive index of the alignment structure is less than or equal to a refractive index of the epitaxial structure.

3. The epitaxial structure according to claim 1, wherein the alignment structure comprises a thermal curable material, and the thermal curable material has a thermal curing temperature between 50° C. and 250° C.

4. The epitaxial structure according to claim 1, wherein the guiding structure is a trench formed in the semiconductor pickup element.

5. The epitaxial structure according to claim 4, wherein the trench comprises a bottom surface and two guiding inclined surfaces, the guiding inclined surfaces are located on both sides of the bottom surface, and a distance between the guiding inclined surfaces increases gradually from the bottom surface to an opening of the trench.

6. The epitaxial structure according to claim 1, wherein the alignment structure extends outward from the semiconductor layer, the guiding structure is a trench formed in the semiconductor pickup element, and the alignment structure is capable of being accommodated in the guiding structure.

7. The epitaxial structure according to claim 6, wherein there are multiple alignment structures and multiple guiding structures.

8. The epitaxial structure according to claim 1, wherein the semiconductor pickup element has a plurality of guiding structures, and the guiding structures are symmetrically arranged on the semiconductor pickup element.

9. The epitaxial structure according to claim 8, wherein a plurality of alignment structures is disposed on a top surface of the semiconductor layer, and from a top view of the epitaxial structure, a shape of the alignment structures on the top surface of the semiconductor layer comprises a straight line, a cruciform asterisk shape, or a combination thereof.

10. The epitaxial structure according to claim 8, wherein the guiding structures have different sizes.

11. The epitaxial structure according to claim 1, wherein the pickup portion comprises:
    a pickup surface recessed on the semiconductor pickup element; and
    a plurality of positioning inclined surfaces disposed around the pickup surface.

12. The epitaxial structure according to claim 11, wherein a distance between the positioning inclined surfaces increases gradually from the pickup surface to an opening of the pickup portion.

13. The epitaxial structure according to claim 11, wherein the semiconductor pickup element further comprises:
    an adhesion layer disposed on the pickup surface, wherein the adhesion layer is disposed between the pickup surface and an opening of the pickup portion.

14. The epitaxial structure according to claim 13, wherein a portion of the adhesion layer is disposed on the positioning inclined surfaces.

15. A semiconductor structure, comprising:
    a semiconductor pickup element having at least one guiding structure and provided with a pickup portion; and
    an epitaxial structure adapted to the semiconductor pickup element, wherein the epitaxial structure comprises:
        a semiconductor layer corresponding to the pickup portion and capable of being picked up by the semiconductor pickup element; and
        at least one alignment structure disposed on the semiconductor layer and corresponding to the at least one guiding structure, so that the epitaxial structure and the semiconductor pickup element are positioned relative to each other, wherein the number of the at least one alignment structure matches the number of the at least one guiding structure.

16. A semiconductor pickup element for transferring an epitaxial structure, comprising:
    at least one guiding structure disposed on a periphery of the semiconductor pickup element; and
    a pickup portion for picking up an epitaxial structure, wherein the epitaxial structure comprises a semiconductor layer and at least one alignment structure disposed on the semiconductor layer, and the alignment structure corresponds to the guiding structure.

* * * * *